US 11,417,822 B2

(12) United States Patent
Bronn et al.

(10) Patent No.: US 11,417,822 B2
(45) Date of Patent: Aug. 16, 2022

(54) FREQUENCY MULTIPLEXING FOR QUBIT READOUT

(71) Applicant: INTERNATIONAL BUSINESS MACHINES CORPORATION, Armonk, NY (US)

(72) Inventors: Nicholas Torleiv Bronn, Long Island City, NY (US); Daniela Florentina Bogorin, Syracuse, NY (US); Patryk Gumann, Tarrytown, NY (US); Sean Hart, Tarrytown, NY (US); Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 231 days.

(21) Appl. No.: 16/718,095

(22) Filed: Dec. 17, 2019

(65) Prior Publication Data

US 2022/0140927 A1  May 5, 2022

(51) Int. Cl.
| | |
|---|---|
| *H01L 39/22* | (2006.01) |
| *H01L 39/02* | (2006.01) |
| *H01L 39/04* | (2006.01) |
| *H01L 27/18* | (2006.01) |
| *G06N 10/00* | (2022.01) |

(Continued)

(52) U.S. Cl.
CPC ............ *H01L 39/223* (2013.01); *B82Y 10/00* (2013.01); *G06N 10/00* (2019.01); *H01L 27/18* (2013.01); *H01L 39/025* (2013.01); *H01L 39/045* (2013.01); *H01L 39/2493* (2013.01); *H03F 19/00* (2013.01); *H03K 19/195* (2013.01); *G06N 10/40* (2022.01); *H03F 2200/198* (2013.01)

(58) Field of Classification Search
CPC ..... H01L 39/223; H01L 27/18; H01L 39/025; H01L 39/045; G06N 10/00; G06N 10/40; H03F 19/00
See application file for complete search history.

(56) References Cited

U.S. PATENT DOCUMENTS

| 5,493,719 A | 2/1996 | Smith et al. |
|---|---|---|
| 8,649,640 B2 | 2/2014 | Sakamaki |

(Continued)

FOREIGN PATENT DOCUMENTS

WO      2011/010469 A1      1/2011

OTHER PUBLICATIONS

Jerger, M. et al, "Frequency Division Multiplexing Readout and Simultaneous Manipulation of an Array of Flux Qubits"; arXiv:1205.6375 [quant-ph] (2012); 4 pgs.

(Continued)

*Primary Examiner* — Aaron J Gray
(74) *Attorney, Agent, or Firm* — Intelletek Law Group, PLLC; Gabriel Daniel, Esq.

(57) ABSTRACT

A system includes a quantum processor includes a plurality of qubits. For each qubit, there is a circulator operative to receive a control signal and an output signal from the qubit. An isolator is coupled to an output of the circulator. A quantum-limited amplifier is coupled to an output of the isolator and configured to provide an output of the qubit. A multiplexor (MUX) is configured to frequency multiplex the outputs of at least two of the plurality of qubits as a single output of the quantum processor.

16 Claims, 8 Drawing Sheets

(51) Int. Cl.
*H03F 19/00* (2006.01)
*H01L 39/24* (2006.01)
*H03K 19/195* (2006.01)
*B82Y 10/00* (2011.01)
*G06N 10/40* (2022.01)

(56) References Cited

U.S. PATENT DOCUMENTS

| | | | |
|---|---|---|---|
| 9,589,236 B1 * | 3/2017 | Abdo | H01L 27/14629 |
| 9,870,536 B1 * | 1/2018 | Abdo | G06N 10/00 |
| 10,063,323 B2 | 8/2018 | Bitauld et al. | |
| 10,171,077 B2 | 1/2019 | Abdo et al. | |
| 10,398,031 B2 | 8/2019 | Abdo et al. | |
| 2018/0138987 A1 | 5/2018 | Sliwa et al. | |
| 2018/0330267 A1 | 11/2018 | Rigetti et al. | |
| 2019/0074911 A1 | 3/2019 | Bitauld et al. | |
| 2019/0190474 A1 | 6/2019 | Abdo et al. | |
| 2020/0034736 A1 * | 1/2020 | Mueller | G06F 1/022 |
| 2020/0287343 A1 * | 9/2020 | Kubo | H03F 3/19 |
| 2020/0320423 A1 * | 10/2020 | Kelly | H01L 39/02 |

OTHER PUBLICATIONS

Abdo, B., et al., "Active Protection of a Superconducting Qubit with an Interferometric Josephson Isolator" Nature Communications (2019); 10 pgs.

Abdo, B., et al., "Multi-Path Interferometric Josephson Directional Amplifier for Qubit Readout"; Quantum Sci. Tech, (2018); vol. 3; 16 pgs.

Barzanjeh, S., et al., "Mechanical On-Chip Microwave Circulator"; arXiv:1706.00376v2 [quant-ph] (2017); 15 pgs.

Bronn, N.., et al., "Broadband Filters for Abatement of Spontaneous Emission in Circuit Quantum Electrodynamics" Applied Physics Letters (2015); vol. 107; 5 pgs.

Chapman, B. J. et al., "Widely Tunable On-Chip Microwave Circulator for Superconducting Quantum Circuits" Physical Review X (2017); vol. 7; 16 pgs.

Anonymous, "Dilution Refrigerator Operations" (2016); 25 pgs.

Mahoney, A. C. et al., "On-Chip Microwave Quantum Hall Circulator"; Physical Review X (2017); vol. 7; 9 pgs.

Chapman, B. J. et al., "Single-Sideband Modulator for Frequency Domain Multiplexing of Superconducting Qubit Readout"; Physical Review X (2017); 9 pgs.

* cited by examiner

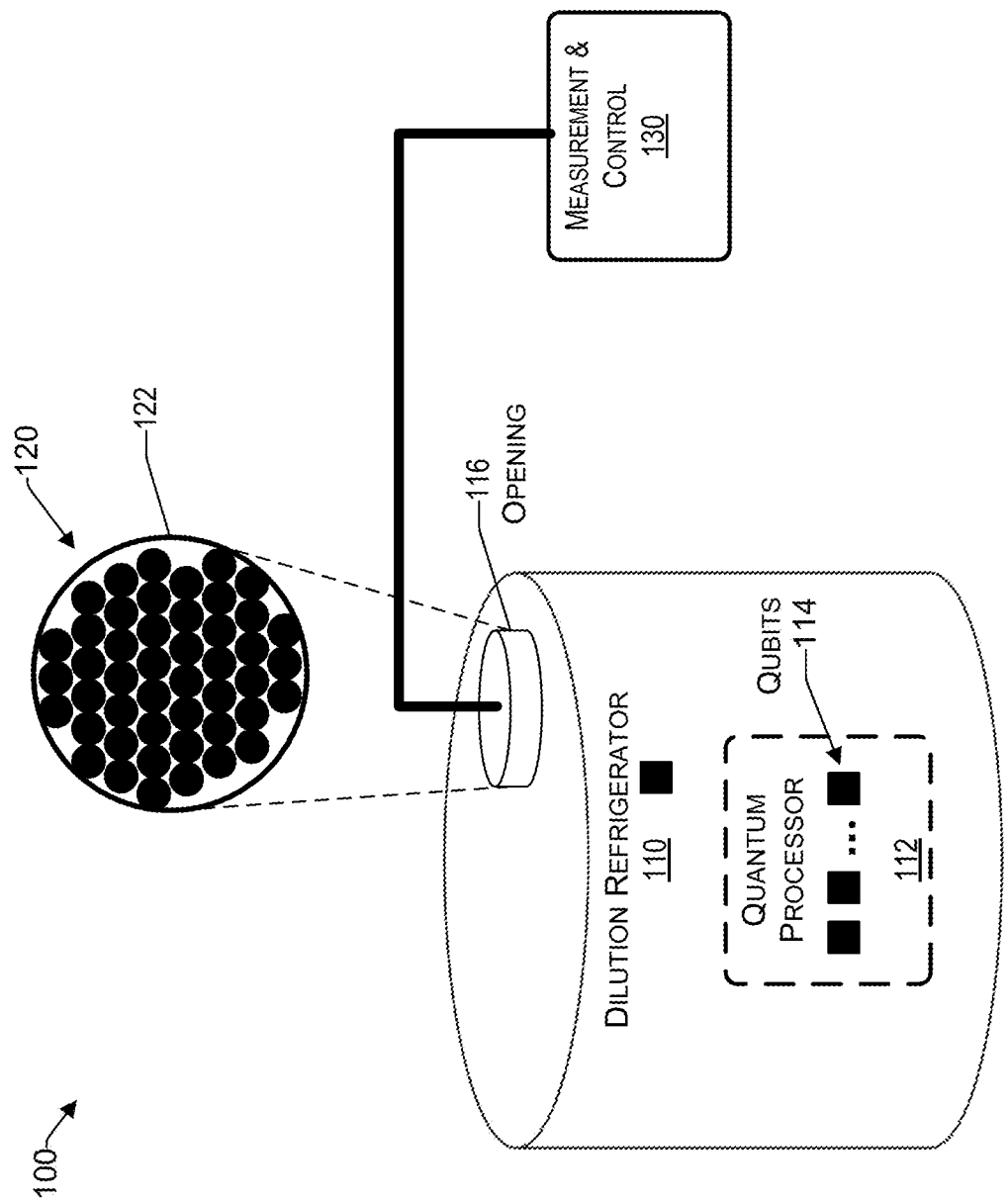

FREQUENCY MULTIPLEXING FOR QUBIT READOUT

BACKGROUND

Technical Field

The present disclosure generally relates to superconducting devices, and more particularly, qubit readout.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

SUMMARY

According to various embodiments, a method and system are provided for reading out signals from a quantum processor having a plurality of qubits. In one embodiment, for each qubit, there is a filter coupled to the qubit. A circulator is coupled to an output of the filter and operative to receive a control signal. An isolator is coupled to an output of the circulator. A quantum-limited amplifier is coupled to an output of the isolator and configured to provide an output of the qubit. A multiplexor (MUX) is configured to frequency multiplex the outputs of at least two of the plurality of qubits as a single output of the quantum processor.

In one embodiment, the control signal is at a different frequency for each qubit.

In one embodiment, there is a readout resonator coupled between the qubit and the filter.

In one embodiment, the quantum-limited amplifier is a Josephson parametric converter (JPC).

In one embodiment, the quantum-limited amplifier is a traveling wave parametric amplifier (TWPA).

In one embodiment, the quantum processor, the MUX, and the filter, circulator and quantum-limited amplifier of each qubit, are on a single printed circuit board.

In one embodiment, the quantum processor, the MUX, and the filter, circulator and quantum-limited amplifier of each qubit, are configured in a dilution refrigerator.

In one embodiment, the MUX comprises one or more 90-degree hybrid couplers. Each 90-degree hybrid coupler is terminated with a resistor to ground. The MUX may have multiple tapered stages configured to collectively provide a single output for all outputs of the plurality of qubits. Each 90-degree hybrid coupler may comprise transmission lines embedded in traces of a printed circuit board.

According to another embodiment, a method of reading out signals from a quantum processor comprising a plurality of qubits is provided. The quantum processor receives a first input operative to measure a state of a first qubit and a second input operative to measure a state of a second qubit of the plurality of qubits. A first circulator routes the first signal to the first qubit. A second circulator routes the second signal to the second qubit. The first circulator routes an output of the first qubit in response to the first signal, to a first input of a coupler. The second circulator routes an output of the second qubit in response to the second signal, to a second input of the coupler. The output of the first qubit and the output of the second qubit are combined by frequency multiplexing, at a first output of the coupler.

In one embodiment, the coupler is a 90-degree hybrid. The second output of the coupler may be terminated to ground via a resistor.

In one embodiment, the method is performed in a refrigerated environment of a dilution refrigerator.

According to another embodiment, a system for combining the outputs of a plurality of qubits is provided. There is a coupler having two inputs and two outputs. A first circulator is coupled to a first qubit and configured to route a first signal to a first qubit and route an output of the first qubit in response to the first signal, to a first input of the coupler. A second circulator is coupled to a second qubit and configured to route a second signal to a second qubit and route an output of the second qubit in response to the second signal, to a second input of the coupler. A first output of the coupler is operative to provide an output that combines the output of the first qubit and the output of the second qubit by way of frequency multiplexing.

In one embodiment, the coupler is a 90-degree hybrid.

In one embodiment, a second output of the coupler is terminated to ground via a resistor.

In one embodiment, the system is in a refrigerated environment of a dilution refrigerator.

In one embodiment, the system further includes a third circulator coupled between the first circulator and the first input of the coupler. A fourth circulator is coupled between the second circulator and the second input of the coupler. A first amplifier coupled to the third circulator and configured to amplify the output of the first qubit before it is provided to the first input of the coupler. A second amplifier is coupled to the fourth circulator and configured to amplify the output of the second qubit before it is provided to the second input of the coupler. A third amplifier is at the first output of the coupler.

In one embodiment, the first and second amplifiers are Josephson parametric converters (JPCs). The third amplifier is a wave parametric amplifier (TWPA).

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1 illustrates an example architecture of a quantum computing system, consistent with an illustrative embodiment.

DETAILED DESCRIPTION

Overview

Figure 2A:
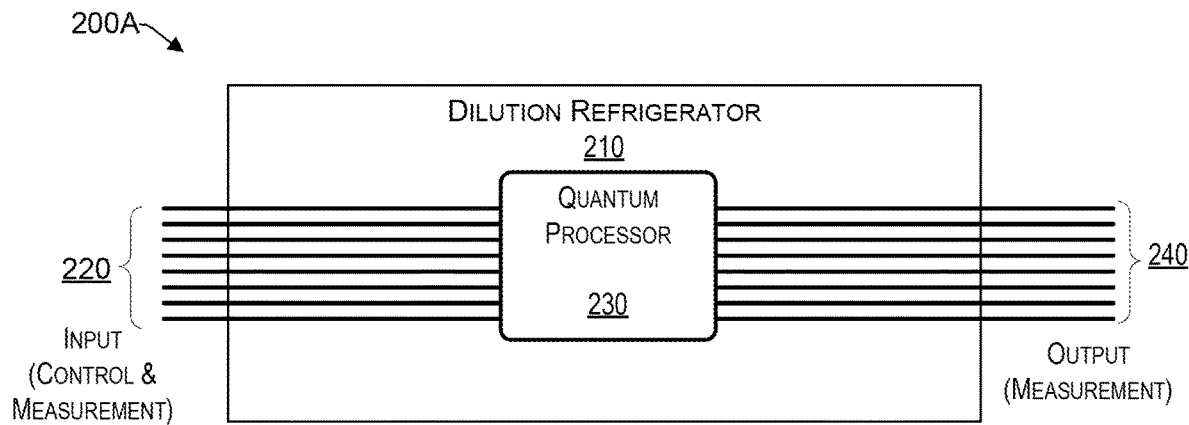
FIG. 2A illustrates a quantum computing system having a same number of outputs as inputs coming out of the dilution refrigerator for the quantum processor.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, efficient readout of a quantum processor having a plurality of qubits. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Much of the process is performed in a cold environment (e.g., in a cryogenic chamber), while the microwave signal is typically measured at room temperature, but some lines of research perform the digitization inside the fridge with either cryogenic CMOS or rapid single-flux quantum logic). The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), or even cryogenic electronics, low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors, as discussed in more detail later.

The ability to include more qubits is salient to being able to realize the potential of quantum computers. Reduction of the temperature of the computing environment below approximately 50 mK to as low as 2 mK is used for the quantum processor to function. Generally, performance improves as temperature is lowered, for example by reducing the residual thermally-excited state qubit population and decreasing the thermal broadening of the qubit transition frequencies. Accordingly, the lower the temperature, the better for a quantum processor.

Applicants have recognized that to increase the computational power and reliability of a quantum computer, improvements are needed along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. For example, in this way, the local information is delocalized such that the quantum computer is less susceptible to local errors and the performance of measurements in the qubits' eigenbasis, similar to parity checks of classical computers, thereby advancing to a more fault tolerant quantum bit.

Example Architecture

FIG. 1 illustrates an example architecture 100 of a quantum computing system, consistent with an illustrative embodiment. The architecture 100 includes a quantum processor 112 comprising a plurality of qubits 114. The quantum processor 112 is located in a refrigeration unit 110, which may be a dilution refrigerator. A dilution refrigerator is a cryogenic device that provides continuous cooling to temperatures as low as 2 mK. Most of the physical volume of the architecture 100 is due to the large size of the refrigeration unit 110. To reach the near-absolute zero temperatures at which the system operates, the refrigeration unit 110 may us liquid helium as a coolant. For example, a "dry" refrigeration unit may operate with two gaseous closed-cycle: one of He-4 that takes the fridge down to 3K (the "pulse tube" cycle) and another of He-3/He-4 mixture that takes the fridge down to 10 mK, or the lowest temperature (the "dilution" cycle). The only liquid in the system is inside the fridge, where the He-3/He-4 mixture condenses.

In the embodiment of FIG. 1, there is a measurement and control unit 130 that is outside of the refrigeration unit 110. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. A practical challenge in known refrigeration devices that house qubits 114 is that the number of qubits that can be accommodated in the refrigeration unit is limited due the number of wires between the measurement and control unit 130 and the qubits 114 measured thereby.

Consider for example a quantum processor 112 having 53 qubits 114. These 53 qubits 114 may involve 53 input lines from the measurement and control unit 130 (e.g., in order to control the qubits), and corresponding 53 output lines (e.g., in order to measure the output of the qubits). There may be one amplifier per qubit, involving 53 "pump lines" to control the corresponding amplifiers of each qubit. Thus, 53 qubits×3 lines per qubit=159 lines 120 between the refrigeration device 110 and the measurement and control unit 130, as illustrated by the top view of the opening 122

As the number of qubits 114 increases, for example above 53 qubits to hundreds, thousands, or more, the opening 116 may not be large enough to accommodate all the lines 120 supporting the quantum processor 112 in the dilution refrigerator 110. Stated differently, access to the vacuum environment of the dilution refrigerator 110 is limited to the number of connectors that can fit through the bulkhead opening 116.

Accordingly, in one aspect, what is provided herein is an architecture that substantially reduces the number lines between a measurement and control unit 130 and a quantum processor 112 that is housed in a refrigerated environment. Multiple qubits 114 of the quantum processor 112 can be read by way of frequency multiplexing the output signals of the qubits 114. These concepts are discussed in more detail below.

Example Block Diagrams

Reference now is made to FIG. 2A, which illustrates a quantum processor 230 having a same number of outputs 240 coming out of the dilution refrigerator as those of inputs 220 leading to the quantum processor 230. Qubit control and measurement involve individual addressability of the corresponding qubits, leading to many lines. These lines can be implemented as radio frequency (RF) coax wires. For example, the input lines may be operated at 5-7 GHz (for control and measurement) and the output lines 240 at around 7 GHz. As the number of qubits in the quantum processor 230 increase, the number of inputs 220 and outputs 240 grow proportionally.

Figure 2B:
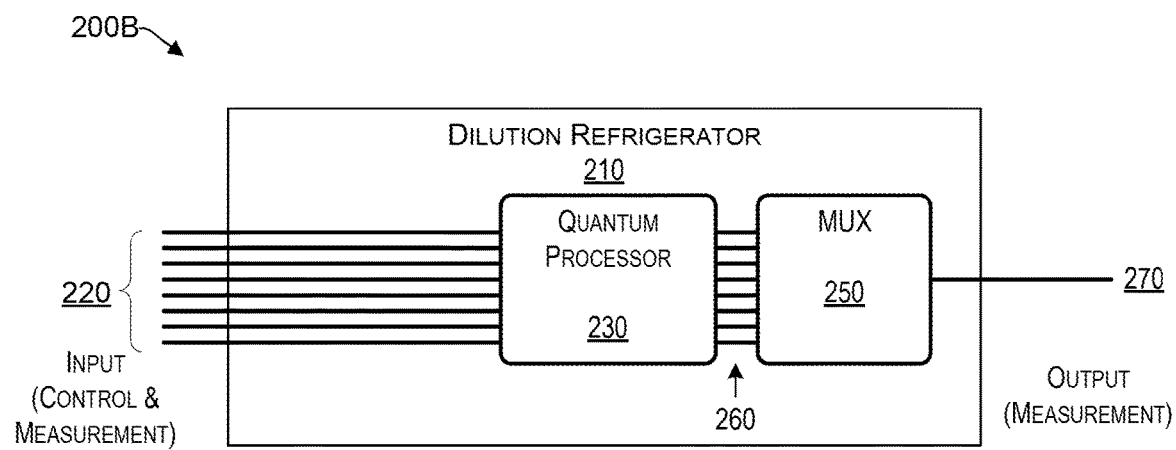
FIG. 2B illustrates a quantum computing system wherein the quantum processor has fewer outputs than inputs into the dilution refrigerator.

In contrast, FIG. 2B illustrates a quantum computing system 200B where the quantum processor 230 has fewer outputs 270 than inputs into the dilution refrigerator 210 for communication with the quantum processor 230. Applicants have identified that once measurements are made of the corresponding qubits in the quantum processor 230, they can be differentiated by frequency, thereby removing the need for separate lines (e.g., coax wires). The multiplexer 250, represented by way of example only and not by way of limitation as an 8:1 mux, allows the combination of the measurements of each of the signals of the corresponding qubits to be on one (or more) lines. For example, each of the outputs 260 from the quantum processor, is at a different frequency, which allows the readout of the plurality of qubits of the quantum processor 230 to be read out by way of frequency division multiplexing. For example, the readouts at the output 260 of the quantum processor 230 are different for each qubit, such as, without limitation, 7.00 GHz, 7.05 GHz, 7.10 GHz, 7.15 GHz, etc., to avoid cross-talk. In this way, the number of lines exiting the dilution refrigerator is substantially reduced, thereby allowing more qubits to be accommodated in a dilution refrigerator.

Figure 3:
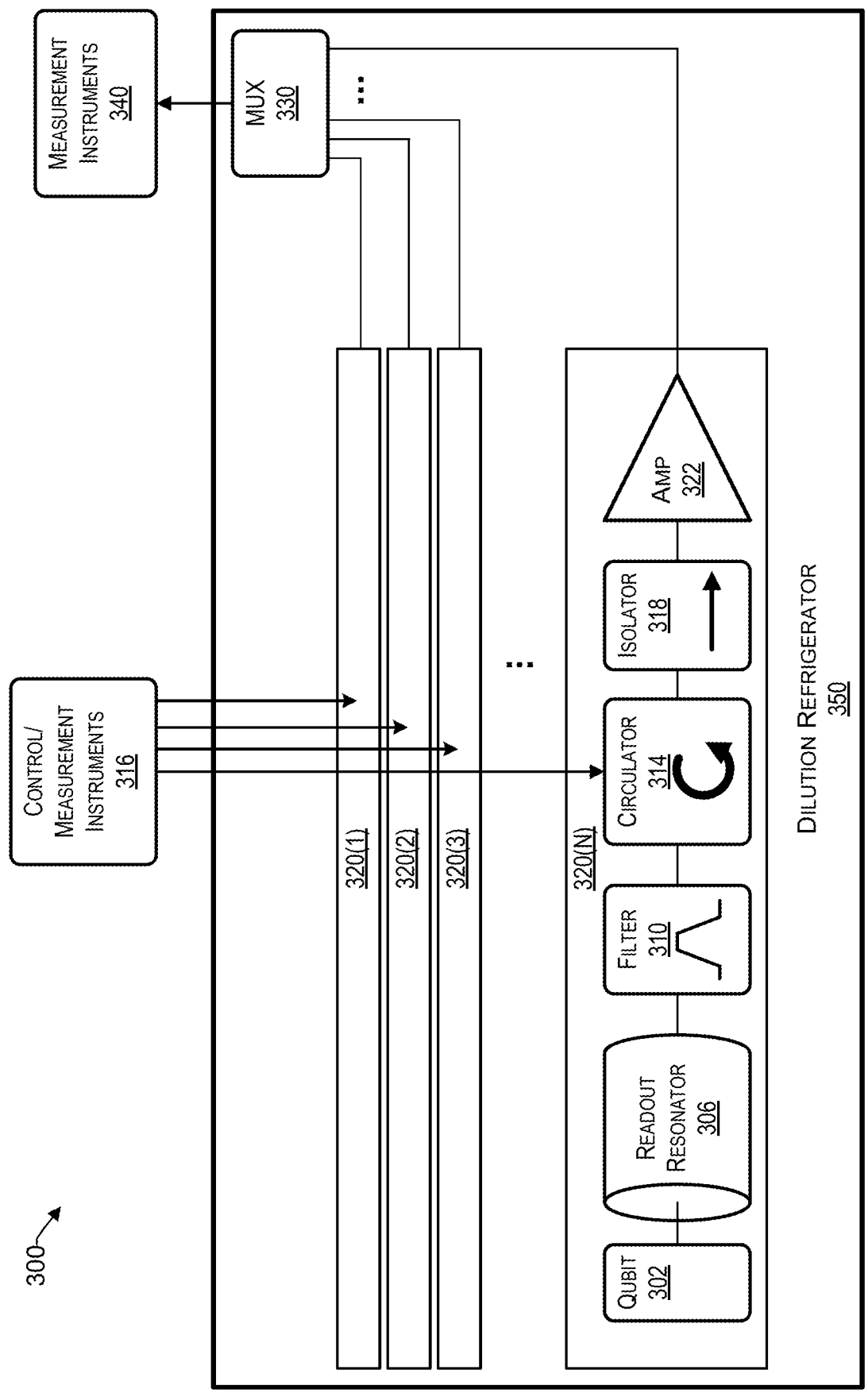
FIG. 3 is an example block diagram of a quantum computing system, consistent with an illustrative embodiment.

Reference now is made to FIG. 3, which is an example block diagram 300 of a quantum computing system, consistent with an illustrative embodiment. Quantum computing system 300 includes a quantum processor comprising a plurality of qubits. As illustrated by way of example and not by way of limitation by block 320(N), each qubit system 320(1) to 320(N) may include a readout resonator 306 coupled to the qubit 302. For example, the readout resonator 306 affects a pulse coming from the control/measurement instruments 316 at the readout resonator frequency (e.g., 7 GHz). The pulse acts as a measurement that decoheres the qubit 302 and makes it collapse into a state of 1 or zero, thereby imparting a phase shift on that measurement pulse. The measurement of each readout resonator of each qubit system 320(1) to 320(N) may be spread out in frequency, as mentioned previously (e.g., 7.00 GHz, 7.05 GHz, 7.10 GHz, 7.15 GHz, etc.).

The readout resonator 306 may be coupled to a filter 310. The measurement fidelity is partially limited by the qubit 302 energy relaxation through the resonator 306 into a transmission line, which is also known as the Purcell effect. One way to suppress this energy relaxation is to use the filter 310, which impedes microwave propagation at the qubit frequency. The circulator 314 routes the input from the control/measurement instruments 316 to the filter 310 on to the qubit 302, at which the reflected measurement in which the state of the decohered qubit has been imparted, returns to the circulator 314 and is routed to the input of an isolator 318 and on to the measurement instruments (i.e. mixers, amplifiers, digitizers). This is an embodiment of a reflection measurement. Measurements may also be made in transmission, in which circulator 314 is not necessary, although this idea makes the most sense for reflection.

In one embodiment, each qubit system 320(1) to 320(N) receives its corresponding control signal from the control/measurement instruments block 316, which lies outside the dilution refrigerator 350. In some embodiments, the control/measurement instruments 316 are inside the dilution refrigerator 350. There is an isolator 318 coupled to the output of the circulator 314. The isolator 318 is a two-port device that has unidirectional transmission characteristics. Stated differently, the isolator 318 allows signals to propagate from the circulator 314 to the amplifier 320 but not from the amplifier 322 to the circulator 314. Any power reflected from the load will be absorbed by the isolator 318, as opposed to being reflected back to the quantum limited amplifier 320. For example, isolator 318 can have approximately 40 dB of suppression in the reverse direction. In various embodiments, different types of isolators that can be integrated can be used, which include, without limitation, a Multi-Path Interferometric Josephson ISolator (MPIJIS) and others. It is noted that isolators may be built from circulators, and the examples within, by terminating one of the three ports with an appropriate resistor (e.g., a 50 Ohm resistor). In various embodiments, the quantum limited amplifier 322 may be a Josephson parametric converter (JPC) or a traveling wave parametric amplifier (TWPA). For example, JPCs are high-gain, low-noise amplifiers that can be used in the readout of the qubit 302. JPCs are typically narrow band (e.g., 10 MHz) but can be tuned over a wide range (e.g., 500 MHz) (i.e. instantaneous vs dynamical bandwidth). As to the TWPA, it uses a non-linear medium (e.g., transmission line that has resonators that include Josephson junctions), or a non-linear medium such as a high kinetic inductance superconductor, where the inductance of the medium depends on the current that is put through it (i.e., thereby making it non-linear). In one aspect, TWPAs discussed herein have a wide bandwidth (e.g., several GHz).

There is a frequency multiplexor (MUX) 330 that is operative to receive the output signal of a plurality (or all) of the qubit systems 320(1) to 320(N). The MUX 330 combines the signals and provides it to measurement instruments 340, which are outside the dilution refrigerator 350. The measurement instruments 340 provide an output representative of a state of each qubit from the corresponding qubit system 320(1) to 320(N).

In one embodiment, the qubit, readout resonator, filter, circulator, isolator, and amplifier of each qubit system, as well as the MUX, are maintained at a low temperature within the dilution refrigerator 350.

Example Mux Implementation

Figure 4:
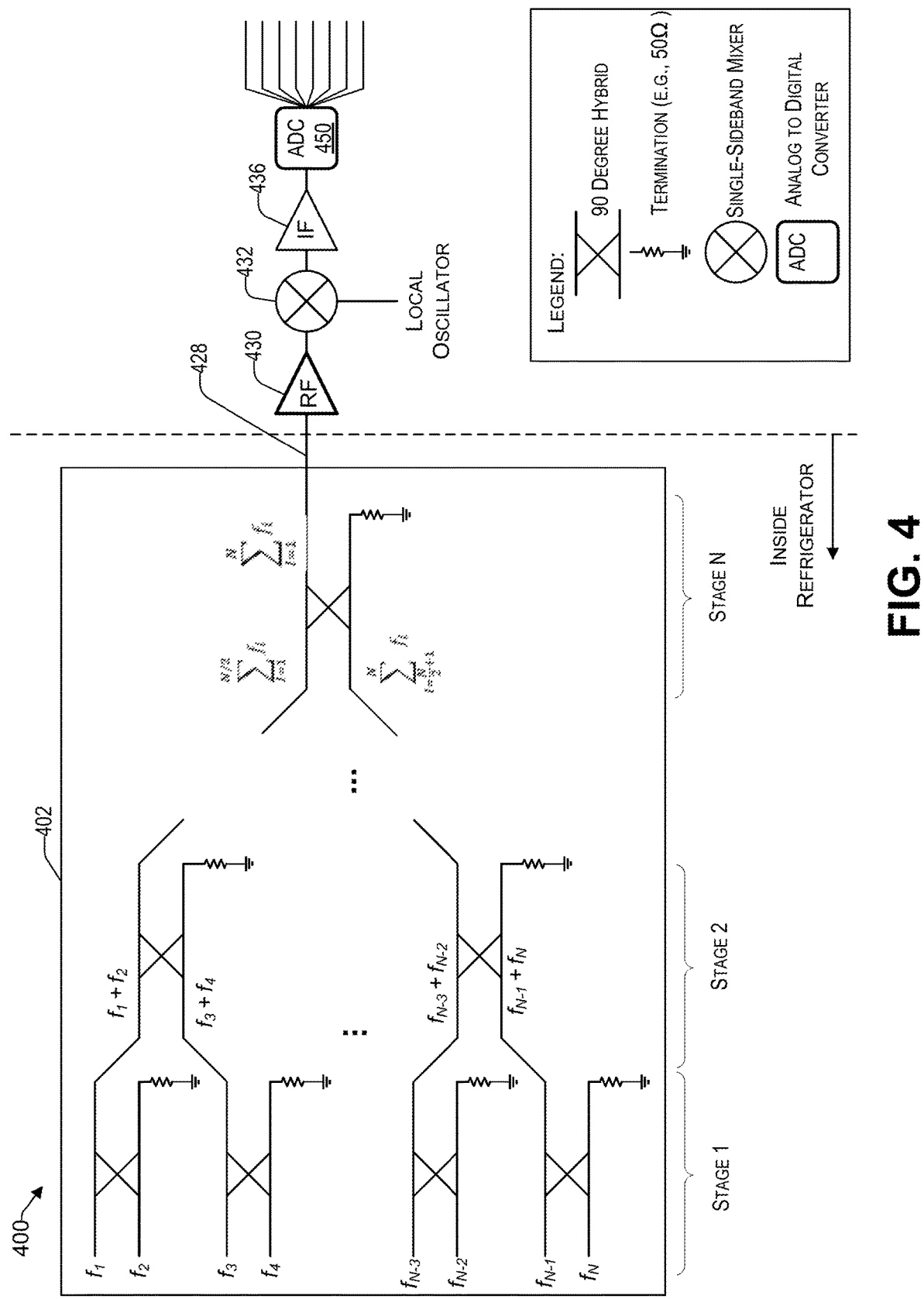
FIG. 4 illustrates a frequency multiplexing architecture, consistent with an illustrative embodiment.

Reference now is made to FIG. 4, which illustrates a frequency multiplexing architecture 400, consistent with an illustrative embodiment. The multiplexing circuit 402 includes one or more couplers that are operative to couple the various signals received from qubits, represented by inputs $f_1$ to $f_N$. In one embodiment, the couplers are 90-degree hybrids. Other implementation of integrated couplers may include, without limitation, Wilkinson power dividers, waveguide directional couplers (e.g., Bethe Hole coupler), Lange couplers, and others. These couplers frequency multiplex the input signals $f_1$ to $f_N$ in progressive stages (e.g., stage 1, stage 2, . . . stage N, with N even in this embodiment) until the number of outputs is substantially reduced (e.g., to 1). For example, inputs $f_1$ and $f_1$ go through a 90-degree hybrid, where a first output of the 90-degree hybrid provides an output $f_1+f_1$, whereas the second output is terminated (e.g., with a 50-ohm resistance to ground). Similarly, input signals $f_3$ and $f_4$ are combined in a first stage, whereas the second stage combines the sum of $f_1+f_2+f_3+f_4$. In the example of FIG. 4, the architecture 400 provides a single output to outside the refrigerator. The signal can then be processed to determine the measured value of each corresponding qubit. For example, there may be a radio frequency (RF) power amplifier 430 that receives the output signal and provides it to a mixer 432 (e.g., single-sideband) that is coupled to a local oscillator. There may be an intermediate frequency amplifier (IF) 436 coupled to the output of the mixer 432. There may be an analog to digital converter (ADC) 450 coupled to the output of the IF amp 436.

In one embodiment, each measurement signal $f_1$ is unique. For example, the measurement signals $f_1$ to $f_N$ may be at different frequencies, such as, without limitation, 7.00 GHz, 7.05 GHz, 7.10 GHz, 7.15 GHz, etc. Accordingly, once digitized by the ADC 450, the corresponding IF signal is also unique and can be digitally discriminated by filters that can be implemented in software or hardware.

Figure 5:
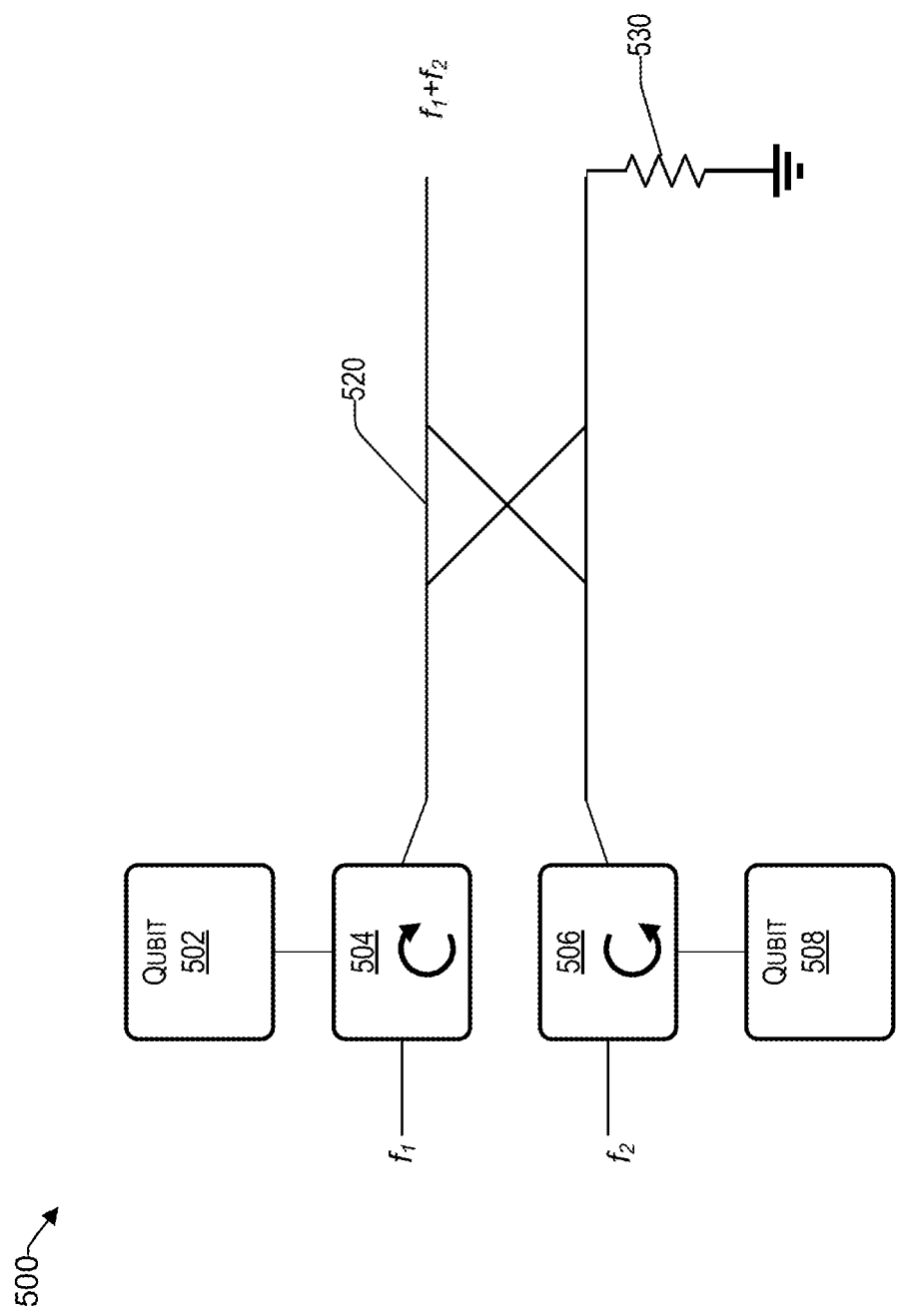
FIG. 5 illustrates a system of combining the outputs of two qubits, consistent with an illustrative embodiment.

In various embodiments, the couplers of the multiplexing circuit 402 may be integrated onto a chip or a circuit board, thereby reducing the overall size of the architecture 400. By virtue of such integration, applicants have identified different structures that can be implemented. In this regard, reference is made to FIG. 5 which illustrates a system 500 of combining the outputs of two qubits, consistent with an illustrative embodiment. For example, when performing a reflection measurement of a qubit, an on-chip circulator, as depicted by way of example in FIG. 5 can be used.

An input $f_1$ comes in to measure the state of the first qubit 502. Accordingly, the signal of the first input is routed by the first circulator 504 to the first qubit 502. The second input $f_1$ is routed by the second circulator 506 to the second qubit 508. The qubit dephases and collapses and imparts a phase shift on the signal $f_1$, which is then routed to the right (instead of left) by the circulator to the 90-degree hybrid 520. It is noted that circulators are normally 3-port devices, although they can be more, which take signals from ports 1→2, 2→3, 3→1 (as indicated by the circular arrow, these ports do not need to be labelled), and are attenuated in the reverse direction, similar to isolators, although suppression is more like 25 dB in the reverse. This may be achieved by the nonlinear effect of Faraday rotation by the magnetic field of a ferrite material. The nonlinear effect is provided by different physical mechanisms known in the art. In various embodiments, different types of circulators can be used, including, without limitation, mechanical on-chip microwave circulators, quantum-hall circulators, gyrators comprising Josephson mixers, and others (all of which can also be used to realize isolators). A substantially similar operation occurs with respect to input signal $f_1$. The circulator 506 ultimately routes the output of the second qubit 508 to the right to the 90-degree hybrid coupler. The 90-degree hybrid then combines the two measurement signals harvested from the first and second qubits 502 and 508. In one embodiment, the entire operation is performed on one integrated chip. In one aspect, the coupling structure 500 facilitates the measurement of qubits in reflection and to combine the resultant measurement signals inside a same package. In some embodiments, the same chip includes the terminator 530 (e.g., 50 Ohm, 75 Ohm, or any other suitable impedance-matched termination resistance).

In some scenarios, the structure 500 may introduce losses, which can be mitigated by way of amplification within the integrated circuit. For example, the 90-degree hybrid coupler 520 may introduce a 3 dB loss. In this regard, quantum-limited amplifiers (e.g., JPC, TWPA) before or after the hybrid can be used. Thus, even if there is loss, it can be recovered by way of local amplification at the integrated circuit level. In some embodiments, the terminator (e.g., 50 ohm) can be integrated onto the same package (e.g., via surface mount technology).

Figure 6:
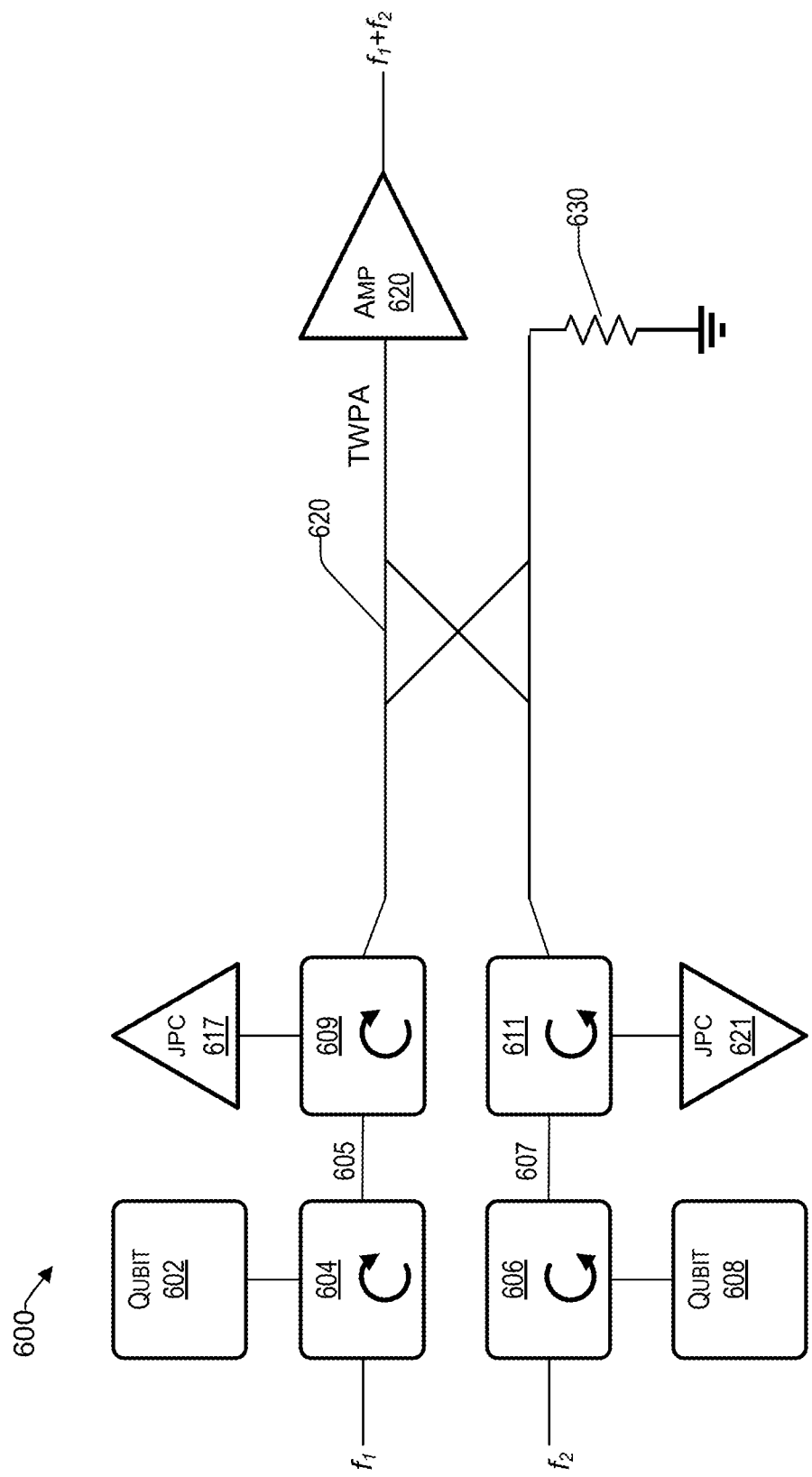
FIG. 6 illustrates another system of combining the outputs of two qubits into a single output, consistent with an illustrative embodiment.

FIG. 6 illustrates another system 600 of combining the outputs of two qubits into a single output, consistent with an illustrative embodiment. Some of the concepts embodied in system 500 are similar to those of structure 500 and are therefore not repeated here for brevity. System 600 can be viewed as a more elaborate implementation of structure 500, which further includes amplification of each qubit output signal by way of an amplifier (e.g., JPC) before the outputs of the qubit measurements are combined by a coupler 620. More particularly, for the first qubit, 602, a first signal $f_1$ is applied to a first qubit 602 via a first circulator 604. A first output 605 is received from the first qubit 602, in response to the applied first signal $f_1$. The first output 605 is routed by a third circulator to the JPC amplifier, which is amplified thereby. JPC's are relatively narrowband (e.g., ~10 MHz), and also work in reflection, which is why they particularly benefit from the third circulator 609.

Similarly, for the second qubit 608, a second signal $f_1$ is applied by a second circulator 606. A second output 607 is received from the second qubit 608 in response to the applied second signal $f_1$. The second output 607 is amplified by a second JPC amplifier 621. The amplified first output is combined with the amplified second output by the coupler 620, which may be 90-degree hybrid. A first output of the 90-degree hybrid 620 is amplified by an amplifier 620 (which may be a TWPA), wherein a second output of the 90-degree hybrid 620 is terminated with a termination resistor 630 (e.g., 50 ohm).

Each of the systems 500 and 600 can be implemented on chip and/or on a printed circuit board. By virtue of including the systems 500 and/or 600 in one or more stages of a MUX, the number of wires that come out of the dilution refrigerator are substantially reduced.

Example Process

Figure 7:
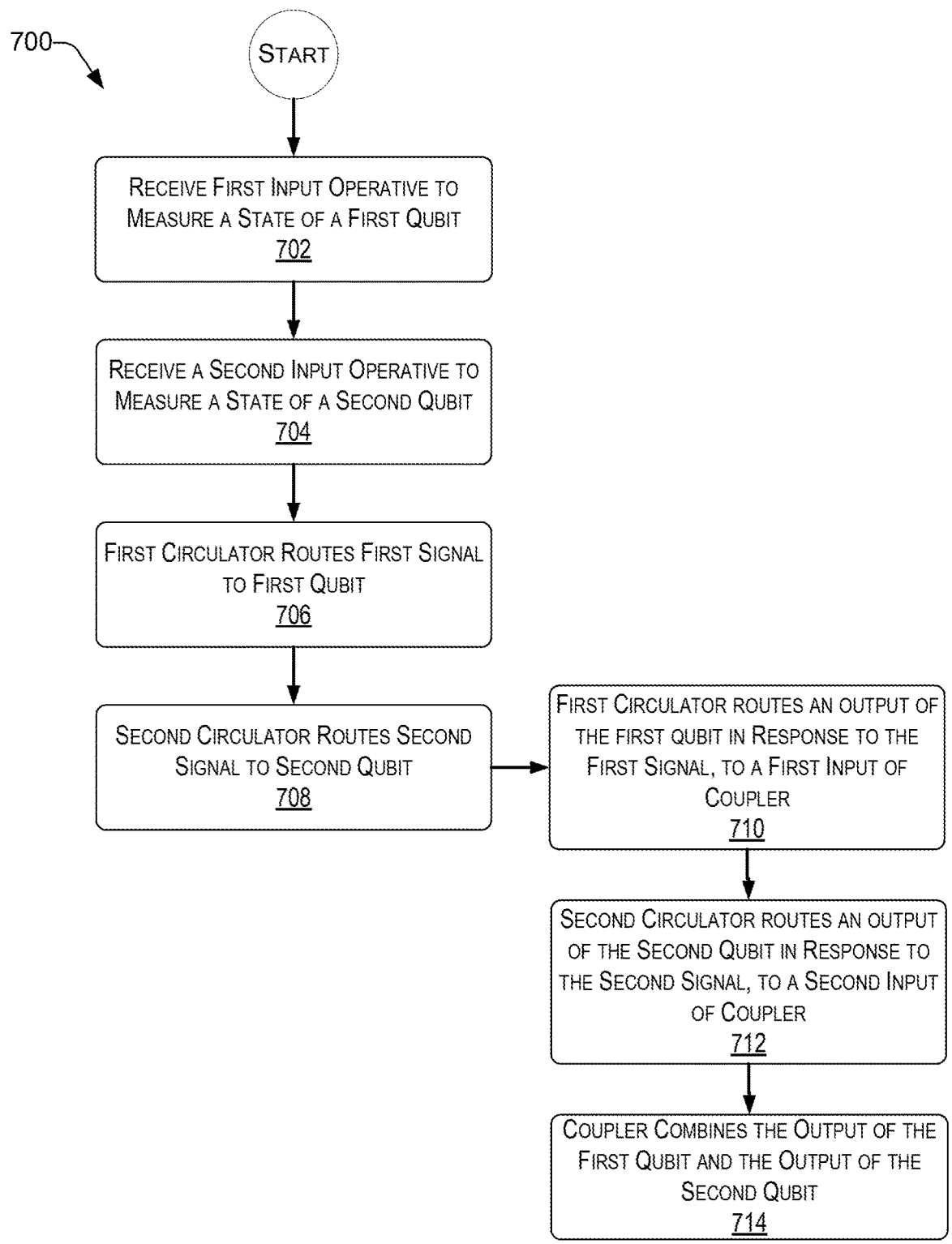
FIG. 7 presents an illustrative process related to reading out signals from a quantum processor.

With the foregoing overview of the example architecture 100, conceptual block diagram 200B, and frequency multiplexing architecture 400, it may be helpful now to consider a high-level discussion of an example process. To that end, FIG. 7 presents an illustrative process related to reading out signals from a quantum processor. Processes 700 is illustrated as a collection of blocks, in a logical flowchart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process. For discussion purposes, the process is described with reference to the architecture of system 500 of FIG. 5.

At block 702, the quantum processor receives a first input $f_1$ operative to measure a state of a first qubit 502. Similarly, at block 704, the quantum processor receives a second input $f_1$ operative to measure a state of a second qubit 508.

At block 706, a first circulator routes the first signal $f_1$ to the first qubit 502. Similarly, at block 708, the second circulator 506 routes, the second signal $f_1$ to the second qubit 508.

At block 710, the first circulator 504 routes an output of the first qubit 502 in response to the first signal $f_1$, to a first input of a coupler 520, which may be a 90-degree hybrid.

At block 712, the second circulator 506 routes an output of the second qubit 508 in response to the second signal $f_1$, to a second input of the coupler 520.

At block 714, the coupler 520 combines the output of the first qubit 502 and the output of the second qubit 506 by way of frequency multiplexing, at a first output of the coupler (i.e., $f_1+f_2$). The second output of the coupler is terminated to ground via a termination resistor 530 (i.e., in the embodiment of 90-degree hybrids). The process 700 is performed in a dilution refrigerator. The quantum processor may have many qubits, which are all implemented on an integrated circuit board or semiconductor chip. Each of the outputs of the qubits may be combined as described herein by additional stages of couplers, collectively referred to herein as the MUX, which may also be integrated onto the same circuit board and/or chip, and operated within the dilution refrigerator. By virtue of frequency multiplexing the outputs of the qubits, the number of outputs of the quantum processor is substantially reduced.

Example Computer Platform

Figure 8:
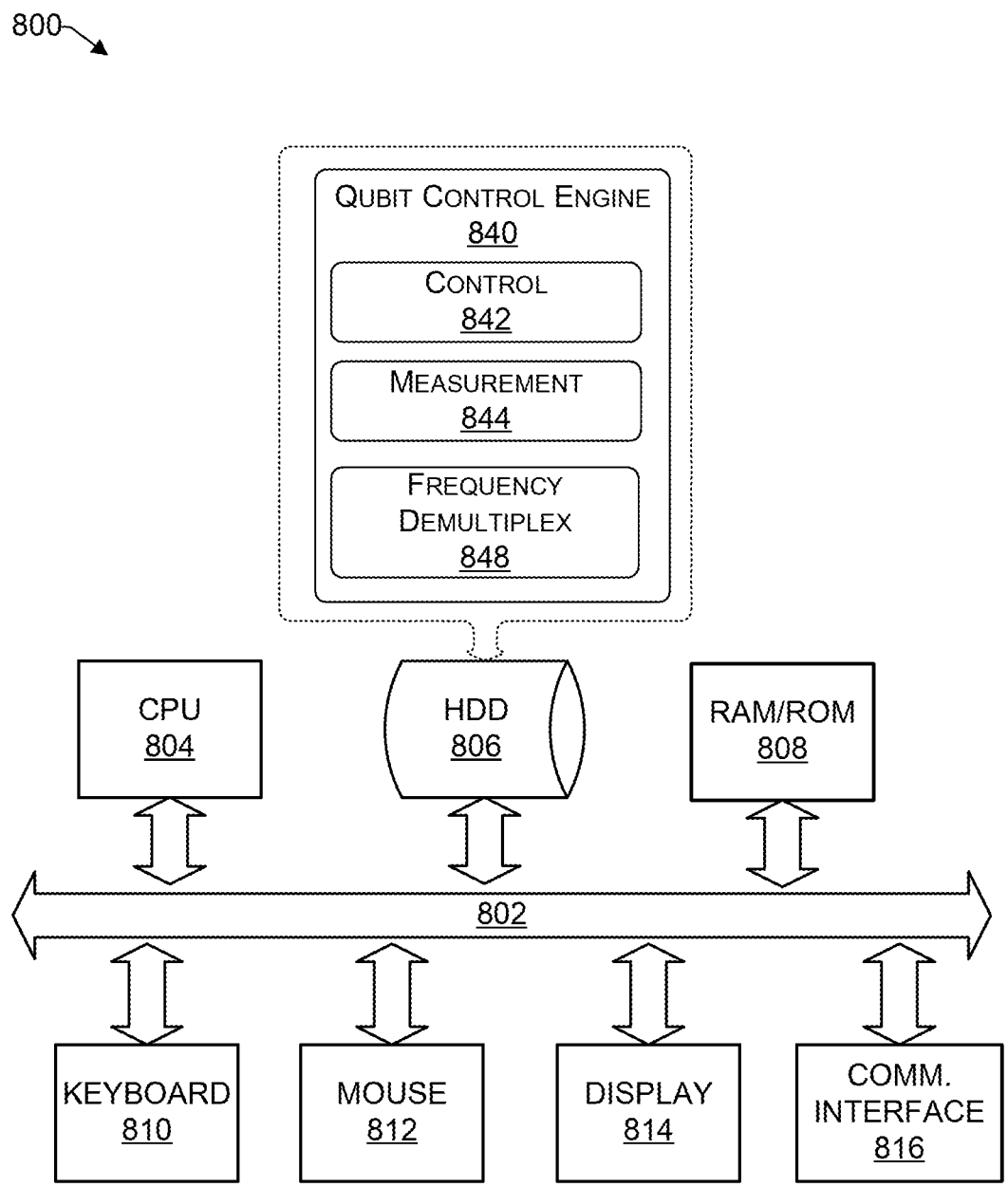
FIG. 8 is a functional block diagram illustration of a computer hardware platform that can be used to implement a particularly configured computing device that can host the qubit control engine.

As discussed above, functions relating to determining the state of various qubits of a quantum processor one or more computing devices connected for data communication via wireless or wired communication, as shown in FIG. 1, and in accordance with the process 700 of FIG. 7. FIG. 8 provides a functional block diagram illustration of a computer hardware platform 600 that can be used to implement a particularly configured computing device that can host a qubit control engine 840. In particular, FIG. 8 illustrates a network or host computer platform 800, as may be used to implement an appropriately configured computing device, such as the measurement and control block 130 of FIG. 1, as well as the control instruments block 316 and measurement instruments block 340 of FIG. 3.

The computer platform 800 may include a central processing unit (CPU) 804, a hard disk drive (HDD) 806, random access memory (RAM) and/or read only memory (ROM) 808, a keyboard 810, a mouse 812, a display 814, and a communication interface 816, which are connected to a system bus 802.

In one embodiment, the HDD 806, has capabilities that include storing a program that can execute various processes, such as the qubit control engine 840, in a manner described herein. The qubit control engine 840 may have various modules configured to perform different functions. For example, there may be a control module 842 that is operative to send control signals to the qubit, similar to that of the control instruments block 316 of FIG. 3. There may be a measurement module 844 operative to perform functions similar to that of the measurement instruments block 340 of FIG. 3. There may be a frequency demultiplex block 848 that is configured to determine which signal corresponds to which qubit.

In one embodiment, a program, such as Apache™, can be stored for operating the system as a Web server. In one embodiment, the HDD 806 can store an executing application that includes one or more library software modules, such as those for the Java™ Runtime Environment program for realizing a JVM (Java™ virtual machine).

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A system, comprising:
   a quantum processor comprising a plurality of qubits;
   for each of at least two of the plurality of qubits:
     a circulator operative to receive a control signal and an output signal from the qubit;
     an isolator coupled to an output of the circulator; and
     a quantum-limited amplifier coupled to an output of the isolator and configured to provide an output of the qubit; and
   a multiplexor (MUX) configured to frequency multiplex the outputs of the at least two of the plurality of qubits as a single output of the quantum processor, wherein the MUX comprises one or more 90-degree hybrid couplers.

2. The system of claim 1, wherein the control signal is at a different frequency for each qubit.

3. The system of claim 1, further comprising:
   a filter coupled to the qubit; and
   a readout resonator coupled between the qubit and the filter.

4. The system of claim 1, wherein the quantum-limited amplifier is a Josephson parametric converter (JPC).

5. The system of claim 1, wherein the quantum-limited amplifier is a traveling wave parametric amplifier (TWPA).

6. The system of claim 1, wherein the quantum processor, the MUX, a filter, the circulator and the quantum-limited amplifier of each qubit, are on a single printed circuit board.

7. The system of claim 1, wherein the quantum processor, the MUX, a filter, the circulator and the quantum-limited amplifier of each qubit, are configured in a dilution refrigerator.

8. The system of claim 1, wherein
   each 90-degree hybrid coupler is terminated with a resistor to ground.

9. The system of claim 8, wherein the MUX has multiple tapered stages configured to collectively provide a single output for all outputs of the plurality of qubits.

10. The system of claim 8, wherein each 90-degree hybrid coupler comprises transmission lines embedded in traces of a printed circuit board.

11. A system for combining the outputs of a plurality of qubits, comprising:
- a coupler having two inputs and two outputs;
- a first circulator coupled to a first qubit and configured to route a first signal to a first qubit and route an output of the first qubit in response to the first signal, to a first input of the coupler; and
- a second circulator coupled to a second qubit and configured to route a second signal to a second qubit and route an output of the second qubit in response to the second signal, to a second input of the coupler, wherein a first output of the coupler is operative to provide an output that combines the output of the first qubit and the output of the second qubit by way of frequency multiplexing.

12. The system of claim 11, wherein the coupler is a 90-degree hybrid.

13. The system of claim 11, wherein a second output of the coupler is terminated to ground via a resistor.

14. The system of claim 11, wherein the system is in a refrigerated environment of a dilution refrigerator.

15. The system of claim 11, further comprising:
- a third circulator coupled between the first circulator and the first input of the coupler;
- a fourth circulator coupled between the second circulator and the second input of the coupler;
- a first amplifier coupled to the third circulator and configured to amplify the output of the first qubit before it is provided to the first input of the coupler;
- a second amplifier coupled to the fourth circulator and configured to amplify the output of the second qubit before it is provided to the second input of the coupler; and
- a third amplifier at the first output of the coupler.

16. The system of claim 11, wherein:
the first and second amplifiers are Josephson parametric converters (JPCs); and
the third amplifier is a wave parametric amplifier (TWPA).

* * * * *